United States Patent [19]

Ullmann et al.

[11] 3,961,270

[45] June 1, 1976

[54] APPARATUS COMPRISING A PLURALITY OF SEPARATE PARTS, AND CONTROL APPARATUS FOR PRODUCING SYNCHRONIZING CONTROL SIGNALS FOR SAID SEPARATE PARTS

[75] Inventors: Werner Ullmann, Locarno; Renato Derighetti, Muralto; Umberto Gagliati, Locarno, all of Switzerland

[73] Assignee: A.G. für industrielle Elektronik AGIE Losone b. Locarno, Losone, Switzerland

[22] Filed: Nov. 7, 1974

[21] Appl. No.: 521,632

[30] Foreign Application Priority Data
Nov. 14, 1973   Switzerland..................... 15994/73

[52] U.S. Cl................................ 328/75; 307/204; 307/219
[51] Int. Cl.².............. H03K 17/00; H03K 17/26; H03K 17/28
[58] Field of Search ............. 328/75; 307/219, 204, 307/221

[56] References Cited
UNITED STATES PATENTS

| | | |
|---|---|---|
| 3,025,508 | 3/1962 | Merl et al. ..................... 307/204 X |
| 3,538,344 | 11/1970 | Schlisser ............................ 207/219 |
| 3,737,674 | 6/1973 | Butler, Jr. ........................... 307/204 |
| 3,760,284 | 9/1973 | Matejka .............................. 207/219 |
| 3,836,859 | 9/1974 | Behrens et al. ....................... 328/75 |

Primary Examiner—Saxfield Chatmon, Jr.
Attorney, Agent, or Firm—Flynn and Frishauf

[57] ABSTRACT

In order to provide respective series of control signals for controlling separate items of apparatus, some of which may be redunant, there are provided a plurality of independently operable signal generators and a plurality of gating circuits connected to the generators and each operable to produce a respective control signal when it receives at least a predetermined number, dependent upon a chosen degree of redundancy of the generators, of correctly timed signals from the generators. Each generator is provided with a phase comparator type timing control device which adjusts the generator if its signals go out of synchronism with those of the other generators. The apparatus to be controlled can be a computer, a multiple-rectifier power supply or the like, and in connecting lines between various parts of the control apparatus and the controlled apparatus isolating devices can be provided.

16 Claims, 9 Drawing Figures

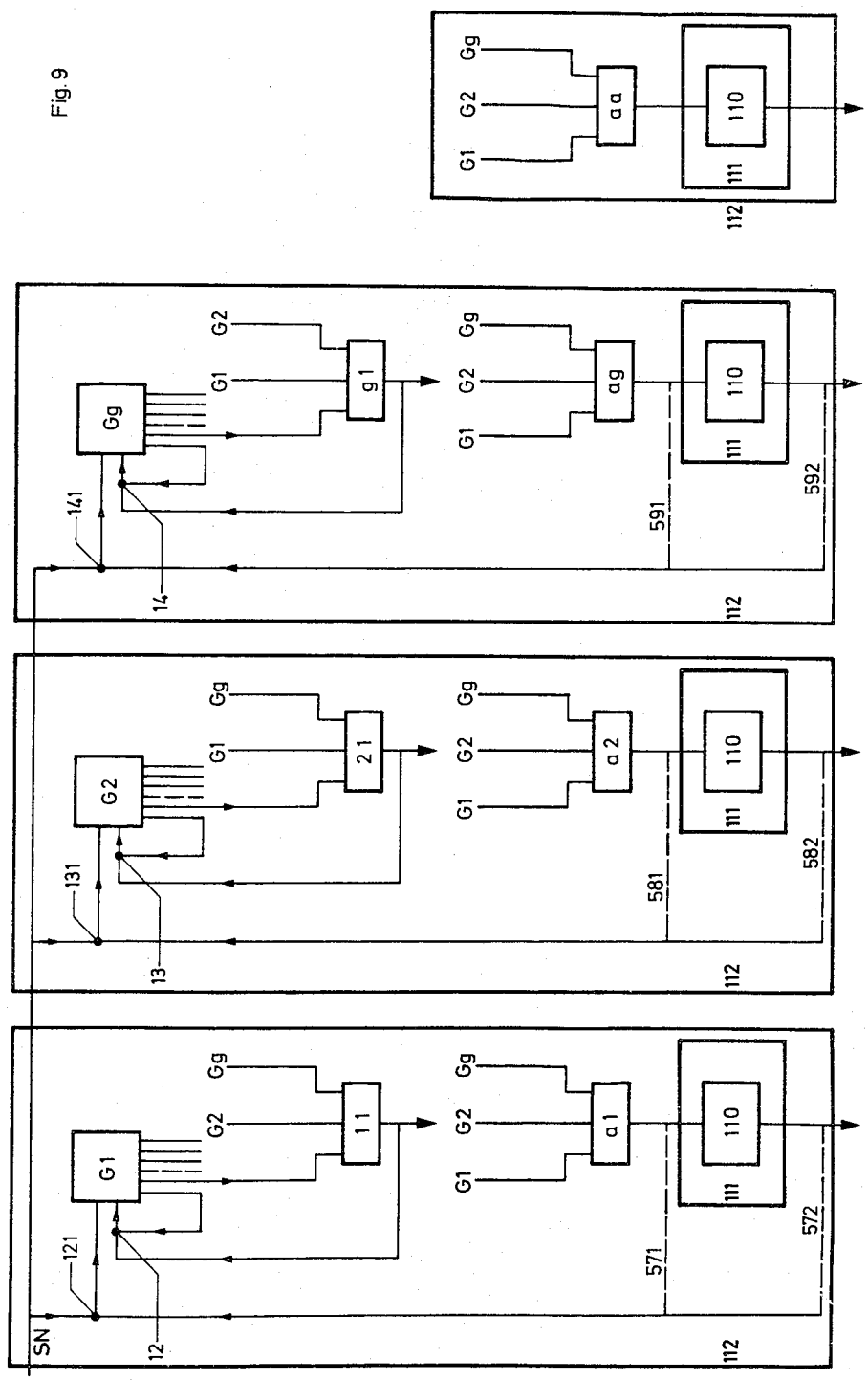

APPARATUS COMPRISING A PLURALITY OF SEPARATE PARTS, AND CONTROL APPARATUS FOR PRODUCING SYNCHRONIZING CONTROL SIGNALS FOR SAID SEPARATE PARTS

This invention relates to apparatus comprising a plurality of separate parts or "items", some of which may be "redundant" (that is to say duplicated so that if one fails it does not necessarily means failure of the apparatus as a whole), which items are to be controlled by synchronising control signals produced by appropriate control apparatus. The invention also relates to the said control apparatus. The control of redundant systems with the aid of signal generators acting as timers is of great importance. By "redundant systems" are to be understood systems which are so combined or assembled from a number of units that, in the event of failure of one unit or of a limited number of such units, the operation of the whole system is not impaired. Such systems are more particularly described in the journal "Technische Rundschau", Nos. 31, 32 and 33, 1973. As timers for such redundant systems, there are often employed timing pulse generators having a number of outputs. Each output is so protected both against short-circuiting and against overvoltage that no reaction on the timing pulse generator is possible. In order to avoid simultaneous failure of all output signals, there are also employed timers consisting of as many timing pulse generators as there are outputs. A synchronising line ensures that the timing pulse generators operate in step with one another. This synchronising line is fed by all the generators. In the case of a redundant current supply, this synchronising line may be identical with the outgoing feeder bus-bar. However, the arrangement of the synchronising bus-bar in the described manner in relation to the generators is not redundant. Interruptions or general disturbances at such a bus-bar will influence the synchronising circuits of each timer. The stability of the whole system is limited, even with optimum choice of the damping and speed of regulation of the synchronising circuits. Even in the case of disturbances which can still be damped, phase differences occur between the signals of the various outputs. In the particular case of voltage generators, these phase errors cause dangerous transverse currents between the parallel-connected outputs.

From this brief outline of the known synchronising systems, it is apparent that the safety and the reliability of the operation of such systems depends upon the properties of the weakest link or element in these systems. In a system constructed in redundant form, the safety and the reliability of the operation depend only upon the probability of faults simultaneously occurring in independently parallel-connected branches.

The object of the invention is to provide a redundant system in which the safety and the reliability of the operation are optimum.

According to one aspect of the invention there is provided control apparatus for producing at a plurality of outputs thereof respective series of control signals for controlling respective items of further apparatus, the control apparatus comprising a plurality of independently operable signal generators, and a plurality of gating circuits which are connected to said generators and each of which is operable to produce a respective control signal in response to the reception thereby of a predetermined plural number, dependent upon a chosen degree of redundancy, of correctly timed signals produced by respective ones of said generators, the gating circuits being connected to supply the control signals produced thereby to respective ones of said outputs, and the apparatus including, for each said generator, timing control means connected to the associated generator for controlling the timing of the signals produced thereby.

Preferably, each said gating circuit is connected to receive the signals produced by all the generators. The number of generators can be the same as, or less than, the number of gating circuits.

Advantageously, said each gating circuit comprises a coincidence gate, such as a majority input gate, which is connected to receive the signals produced by a number of said generators and which is operable to produce a control signal when, and only when, it receives at least $g-r$ substantially coincident signals from said $g$ generators, the said chosen degree of redundancy thus being equal to $r$.

Each said timing control means can comprise a comparator having a first input connected to receive the signals produced by the associated generator, a second input connected to receive the control signals produced by one of said gating circuits, an an output connected to a control input of said associated generator, the comparator being operable to compare the signals received at its first input with the signals received at its second input and, if they do not coincide, to adjust said associated generator to bring them more into coincidence.

Alternatively, or in addition, each said timing control means can comprise a comparator having a first input connected to a common synchronizing signal input of the control apparatus, a second input connected to receive the control signals produced by one of said gating circuits, and an output connected to a control input of said associated generator, this comparator being operable to compare the signals received at its first input with the signals received at its second input and, if they do not coincide, to adjust said associated generator to bring them more into coincidence.

Preferably, each said generator has, for each gating circuit to which it is connected, a respective separate output terminal connected to the respective gating circuit by a respective separate signal transmitting line, and a further separate output terminal by which the generator is connected to its associated timing control means. For each said generator output terminal which is connected to a gating circuit, and preferably also for the said further output terminal, the generator can comprise a respective output amplifier stage for amplifying the signals supplied via the associated generator output terminal. These outputs amplifier stages preferably comprise short-circuit protection means for protecting the output amplifier stage from becoming damaged if a short-circuit occurs on the associated generator output terminal, and signal limiting means for protecting the output amplifier stage from becoming damaged if over-voltages occur in an output connecting line connected to the associated generator output terminal.

In embodiments where there are signal transmitting lines connected to said generators for delivering the signals produced by the generators, the transmitting lines can comprise respective series connected isolating devices which are operable to pass the signals produced by the generators and to reject disturbing signals. These isolating devices can, in embodiments in which said signals produced by the generators are electrical signals, comprise first converter means for converting the electrical signals received thereby into non-electrical signals, such as optical, acoustic, pneumatic or hydraulic signals, and second converter means arranged for receiving the non-electrical signals from the associated first converter means and for converting them back into electrical signals.

According to a second aspect of the invention, there is provided a combination of control apparatus as described above and further apparatus such as a computer or multiple element power inverter, comprising controllable items of which some are redundant, said items being connected to respective ones of the said outputs of the control apparatus for receiving respective series of control signals therefrom.

The control apparatus can be constructed as a self-contained unit which is connected to the further apparatus by way of signal transmitting lines. Alternatively, said gating circuits may be constructed as parts of the respective items of apparatus to which they are connected, or said items can each comprise, constructed as part of the item, a said generator, at least one said gating circuit, and at least one said timing control means.

DESCRIPTION OF THE DRAWINGS

For a better understanding of the invention and to show the same may be carried into effect, reference will now be made, by way of example, to the accompanying drawings, in which:

FIGS. 6, 7, 8 and 9 are simplified circuit diagrams of respective embodiments of control apparatus and further apparatus combination in accordance with the invention.

DETAILED DESCRIPTION OF THE INVENTION

Figure 1:
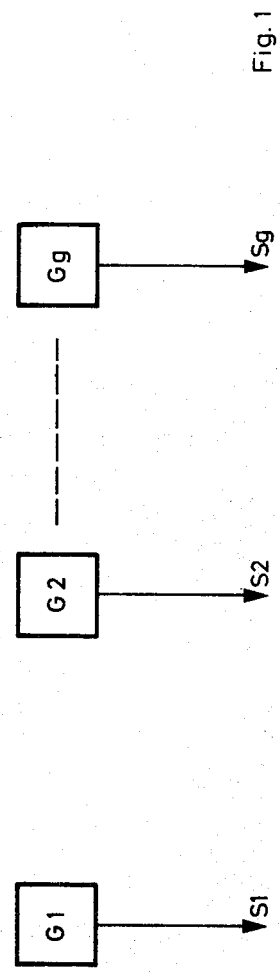
FIG. 1 is a simplified circuit diagram of a plurality of separate signal generators suitable for separately controlling items of further apparatus.
Figure 2:
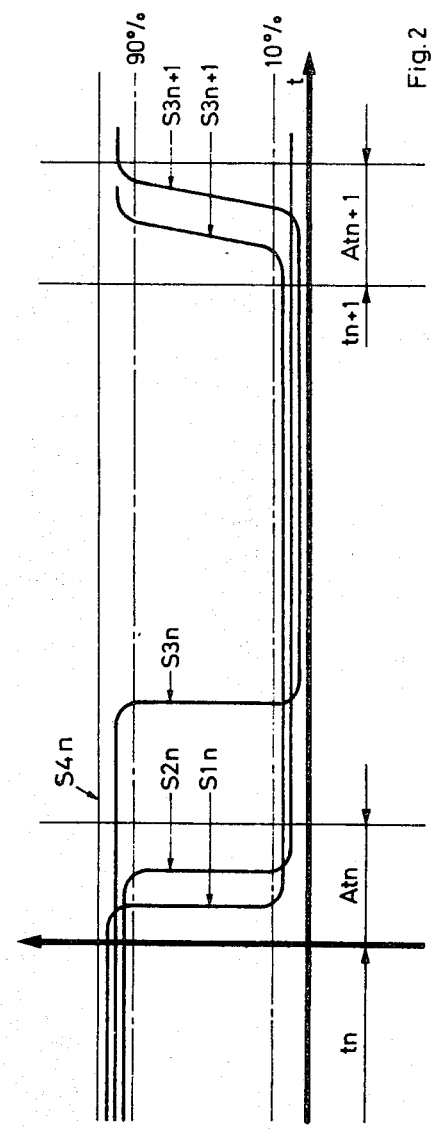
FIG. 2 is a waveform diagram showing the waveforms of some possible signals produced by the generators of FIG. 1, FIGS. 3, 4 and 5 are simplified circuit diagrams of respective embodiments of control apparatus according to the invention.

In FIG. 1, there are shown a plurality of generators G1, G2 and Gg, only three being actually drawn although it will be understood that there could be more than three. Each of these generators is independent of the others and has one output at which the respective output signals S1, S2 to Sg are present. These signals control a system, for example a computer or a continuous current supply system, consisting of a plurality of separate items respective ones of the items being connected to receive the respective signals S1, S2 . . . Sg. Since the generators G1, G2 . . . Gg are independent from one another they can only properly be used to control items which are also independent from one another because, as shown in FIG. 2, the control signals may get out of synchronism with one another. By "control signals" are meant physical quantities which exhibit, as a function of time, a variation which is characteristic of the particular nature of the generator, such as, for example, variation of a pressure in the case of a pressure medium, or variation of luminous intensity or variation of sound intensity, or variation of electric current or of voltage. There may be described as a characteristic variation, for example, a variation as a function of time of the signal amplitude between 10% and 90% of the maximum signal amplitude. Also, a variation in the opposite direction from 90% to 10% may be assumed. In addition, it may be assumed that the whole duration of this variation is to be a fraction of the time interval between two successive variations. Each one of the signals $S1n$, $S2n$ to $Sgn$ is defined as correct if it at least substantially coincides with a set number of other signals i.e. if its characteristic variation occurs, with predetermined polarity, in a prescribed time interval $\Delta t$ during which there occurs also the characteristic variations of the set number of the other signals. The incorrect signals are thus also defined, i.e. the incorrect signals have no characteristic variation in the time intervals $\Delta t$. The absence of characteristic variations in the signals is thus clearly defined as an error. It is further assumed that only a limited number $r$ of signals $S1n$, $S2n$, etc., to $Sgn$ may be incorrect. In FIG. 2, the signals S1 and S2 comprise characteristic variations $S1n$, $S2n$ from 90% to 10% of maximum amplitude during the time $tn$ to $tn + \Delta tn$ and so these signals are correct as far as this point. The other two signals are incorrect, the characteristic variations $S3n$ of S3 coming by itself outside the interval $\Delta tn$ and S4 not varying at all. The two generators 1 and 2 of FIG. 1 therefore control their units of the system with correct signals $S1n$ and $S2n$ while two other generators of FIG. 1 control their units of the system with incorrect signals $S3n$ and $S4n$. In FIG. 2, a further time interval $\Delta tn$ is shown after the time $tn+1$, during which two of the signals S1 and S3 vary from 10% to 90% of their maximum levels while the signals S2 and S4 do not vary. Thus the signals S1 and S3 are correct here and the other two signals are not.

Figure 3:
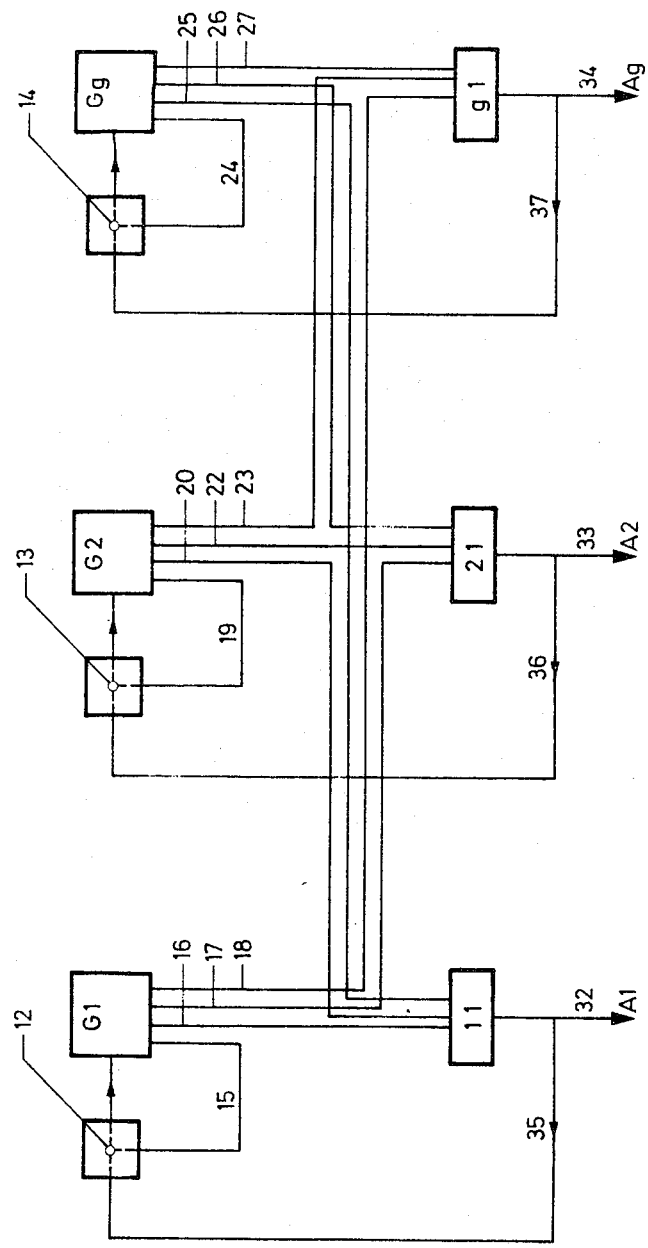

A first embodiment of control apparatus according to the invention is illustrated in FIG. 3 and is for use in controlling further apparatus (not shown) consisting of a plurality of independent units. The control apparatus comprises a plurality of signal generators G1, G2 to Gg, an equal number of majority input coincidence gates 11, 21 to g1 and an equal number of phase comparators 12, 13 to 14. Only three generators, three gates and three phase comparators are shown but it will be understood that this represents three or more, i.e. a number g of each part. Each of the generators has output lines 15, 16, 17, 18; 19, 20, 22, 23; 24, 25, 26, 27 and is connected to each coincidence gate by means of one output line. Thus, the generator G1 is connected by the output line 16 to a first input of the coincidence gate 11, by means of the line 17 to a first input of the coincidence gate 21 and by means of the line 18 to a first input of the coincidence gate G1. If there are more than three generators and three coincidence gates, then the generator is connected to the other gates by respective further output lines. Similarly the generator G2 is connected to respective second inputs of the coincidence gates by the respective lines 20, 22 and 23 while the generator Gg is connected to respective third inputs of the gates by the respective lines 25, 26 and 27. Each generator applies the same signals S1, S2 . . . or Sg to its outputs.

As already stated with reference to FIG. 2, it is also assumed with reference to FIG. 3 that a limited number $r$ of the output signals passing through the output lines of the $g$ generators might be incorrect in the neighbourhood of the times $tn$ and $tn+1$ whereby $g - r$ correct signals are fed to each of the coincidence gates. If and only if the gates receive $g - r$ coincident signals from the generators, they each then produce an output signal A1, A2 . . . A$g$ which passes to the respective output lines 32, 33 and 34 and then to the control input of the associated units of the further apparatus (not shown). If the gates receive a number of coincident signal(s), which number is less than $g - r$, then that or those signals is or are defined as incorrect and the gates do not respond. In the embodiment shown, the gates are majority input gates which gives the condition $r<g-r$ or, to put it another way, $g>2r$.

If one of the generators G1, G2, etc., to G$g$ is to be able to emit a false signal $r=1$, without incorrectly influencing the further apparatus, the number $g$ of generators required is larger than 2. In other words, at least three generators G1, G2, G$g$ are required. In this case, the coincidence circuits 11, 21, $g$1 establish the coincidence of at least two correct signals $g-r$. The control apparatus can then be said to have a "degree of redundancy" of one. If there is to be controlled by the control apparatus, a system in which two signals can be incorrect ($r=2$), without incorrectly influencing and controlling the system, one speaks of a degree of redundancy of two. In this case, more than four generators are required in accordance with the aforesaid addition condition $g>2r$. In other words, at least five generators are required together with five coincidence circuits which detects the coincidence of at least $g-r = 3$ correct signals. If $r=4$ incorrect signals are to be permitted, i.e. a degree of redundancy of four, at least nine generators are employed. The nine coincidence circuits then detect the coincidence of $g-r=5$ correct signals. In each case, only the correct signals pass to the units of the further apparatus and such correct signals pass to all such units.

The output lines 15, 19 and 24 of the generators G1, G2, G$g$ are each connected to one input of the associated phase comparator 12, 13 or 14. The output signal passed into the line 15, 19 or 24 is the same as the output signal passed into the other output lines of the respective generators. Thus, these output signals form "actual-valve" signals and, via the feedback lines 35 to 37, each phase comparator also receives at a second input thereof "desired value signals" comprising the correct output signals which appear at the outputs of the gates 11 to $g$1. If, for any particular generator, the actual-value signals do not coincide with the desired-value signals, the associated phase comparator detects this and then so controls the repetition frequency of the generator as to bring the actual-value signal into phase with the desired-value signal. There is thus produced an automatic matching of the so-called "incorrect" generators to the so-called "correct" generators. The stability of the individual generators and the properties of the phase detectors 12 to 14, are so chosen that, at all times, there are at least $g-r$ generators producing "correct" signals, i.e. signals whose characteristic variations occur within the tolerance intervals $\Delta t$ such as $\Delta tn$ and $\Delta tn+1$ shown in FIG. 2.

Figure 4:
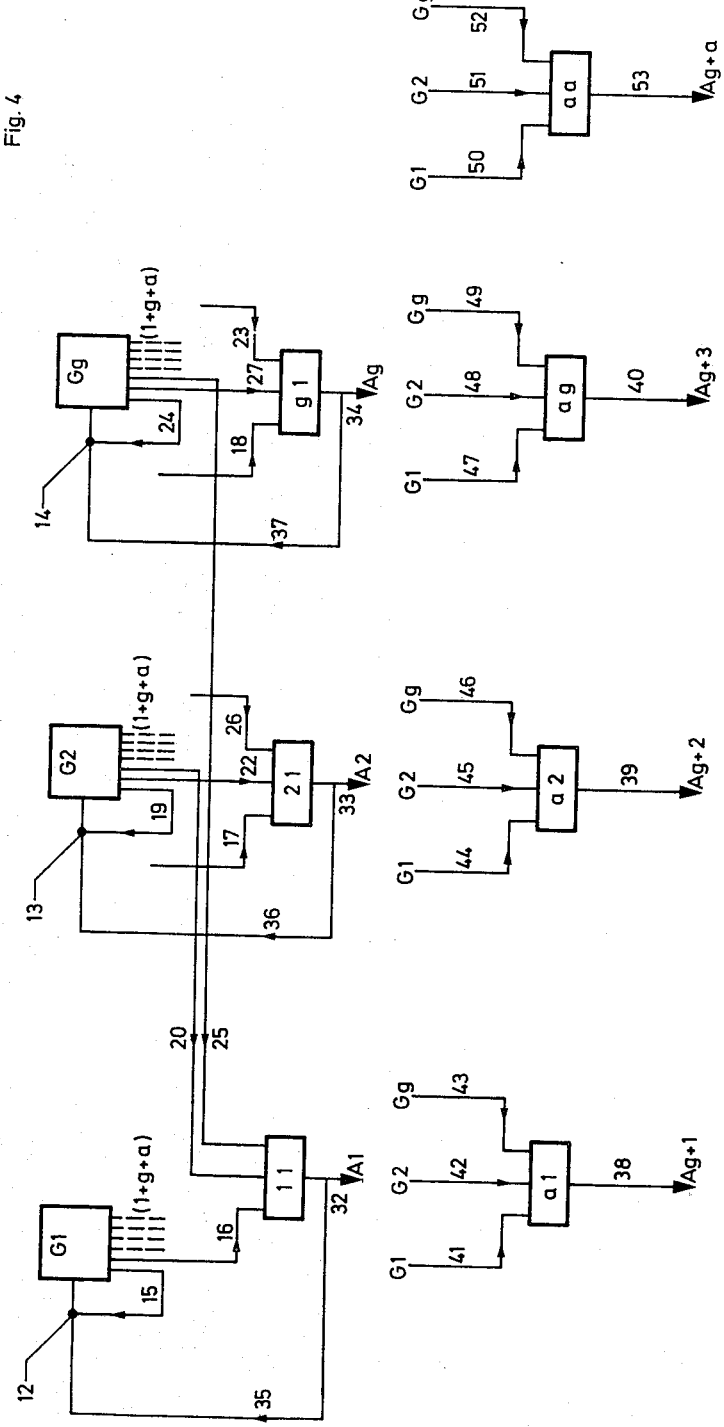

The number of coincidence gates, and hence the number of separate outputs of the control apparatus, may be greater than the number of generators, as in the embodiment shown in FIG. 4 where those parts which are the same as parts in FIG. 3 are given the same references. Such an embodiment may be used in cases where the required degree of redundancy dictates that a particular number of generators be employed, and it is not desired to have more than that particular number of generators, but the number of units of the further apparatus is greater than this particular number. The control apparatus in FIG. 4 has a degree of redundancy of one and so it comprises three G1, G2 and G$g$ generators but more than three i.e. seven units of the further apparatus are to be controlled and so seven coincidence gates 11, 21, 22, $g$1, $a$2, $ag$ and $aa$, and hence seven outputs are provided. The output signals are again formed by the respective coincidence gates in accordance with the previously described condition i.e. the coincidence of at least two ($g-r$) output signals. There could of course be more than three generators even though these are not all essential in order to obtain the required degree of redundancy. If the degree of redundancy has to be greater than one, then of course there must be more than three generators. As before, each generator has a plurality of outputs connected to respective inputs of respective ones of all the coincidence gates. Thus, the generator G1 is connected by means of lines 16, 17, 18, 41, 44, 47, 50, through all of which the same signals S1 passes, to first inputs of the respective coincidence gates 11, 21, $g$1, $a$1, $a$2, $ag$ and $aa$. Similarly, the generator G2 has output lines 20, 22, 23, 42, 45, 48 and 51 connected to the second inputs of the respective coincidence gates and the generator G$g$ is connected by means of lines 25, 26, 27, 43, 46, 49 and 52 to the third inputs of the respective coincidence gates. As mentioned before, the number of generators could be other than three. Also, the number of coincidence gates could be other than seven. As a general case, there will be $g$ generators and $g+a$ coincidence gates. Thus, each generator requires a number $g+a+1$ of outputs because one output is provided for the respective phase comparators 12, 13, 14 which are shown only as dots in FIG. 4 for the sake of simplicity. As before, the extra outputs of the generators are connected by way of lines 15, 19 and 24 to the phase comparators 12, 13 and 14 respectively and, the output signals A1, A2, A$g$ are supplied to respective second inputs of the phase comparators by way of the lines 35, 36 and 37 so as to control the associated generators in the manner described with reference to FIG. 3. All the gate output signals are fed via the respective output lines 32–34, 38–40 and 53 to the independent units of the further apparatus (not shown) for example, a computer, a continuous current supply system in which there are a large number of independently operating inverters, or a rolling mill or rotary printing installation in which there are a plurality of independent drive units, and so on.

The theoretical reliability of the embodiments of FIGS. 3 and 4 is dependent upon possible reactions of disturbances through the lines between the generators G1, G2, etc., G$g$ and the coincidence circuits 11, 21, G1, $a$1, $a$2, $a$3, etc., $aa$. These conductors should therefore be free from reaction. This applies more particularly to long lines when the coincidence circuits and the generators are a great distance apart. Thus, the embodiments of FIGS. 3 and 4 may be improved by employing non-reacting lines. The lines may be made non-reacting in the following two ways: for each line, there is provided in the generator an output stage which amplifies in respect of energy the output signals S1, S2 . . . S$g$; the stages are resistant to short-circuiting and protected against feedback by so-called signal limiters; output amplifiers resistant to short-circuiting are important in case a short-circuit should occur between the lines, the short-circuit protection then preventing the generator from damage. The signal limiter is provided in order that the so-called useful signals S1, S2 . . . Sg may not exceed a particular upper limit; in this way, over-voltages which may occur in the lines due to induction or due to conductive contact with higher voltages cannot have any reaction on the associated generator; such disturbances (overvoltages) considerably exceed the upper value fixed by the signal limiter, so that they can readily be eliminated. The signal limiter will normally be combined with the output stage but it could be separate from the output stage and some distance therefrom; in addition to the output stage in the generator, a series-connected intermediate isolating device is introduced into each of the said lines.

Figure 5:
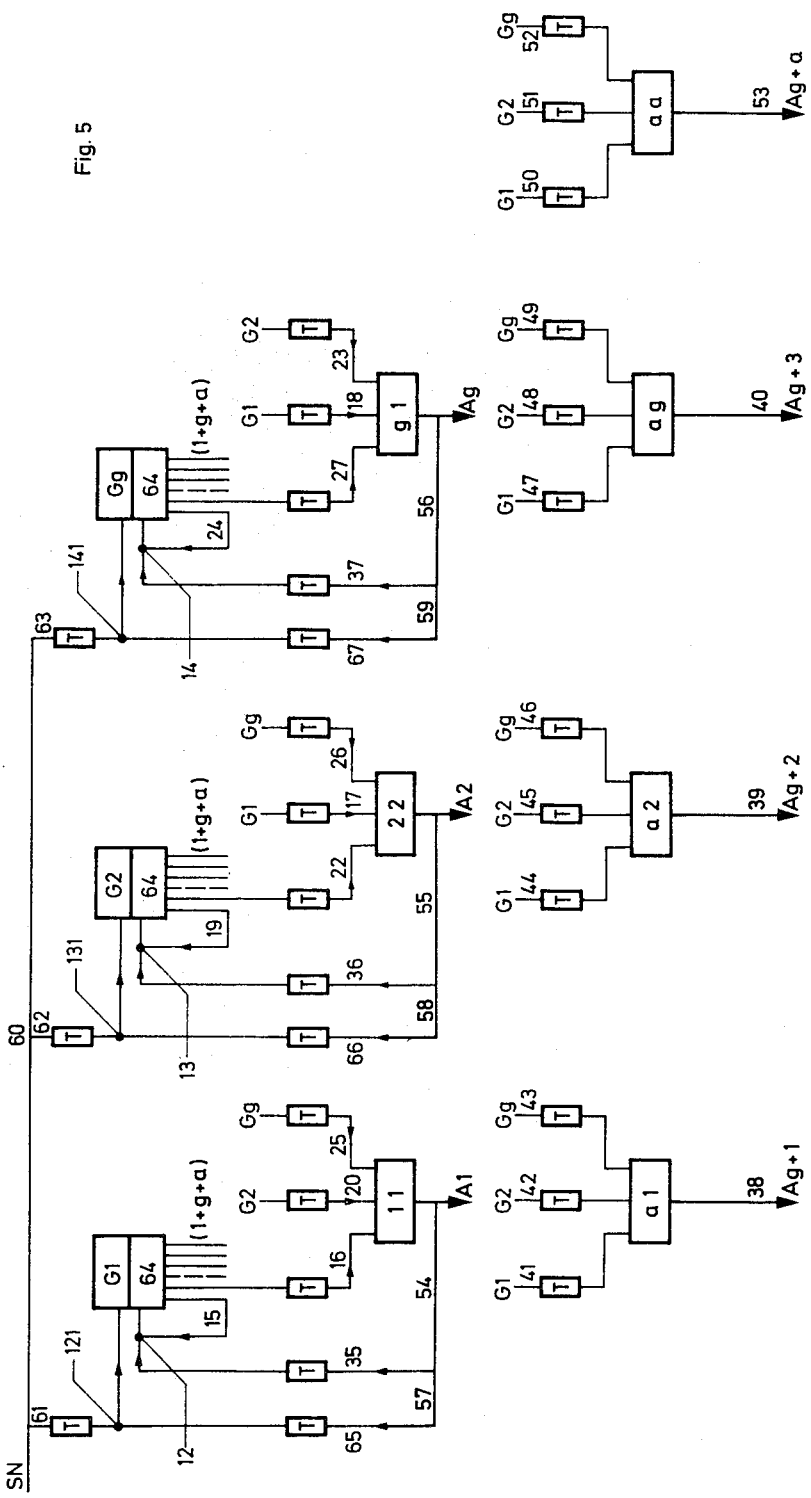

Such intermediate isolating devices are used in the embodiment illustrated in FIG. 5. These isolating devices T are provided in all the lines between the generators and the coincidence circuits and in various other connecting lines. The object of the isolating devices is to ensure that, in common with the output stages in the generators, disturbances which may occur in the lines or in the individual circuits as already described are not transmitted in the reverse direction to the normal flow of information, and they may be constructed in several different ways, the construction most suitable for the purpose in hand being chosen. In order to obtain optimum isolation of disturbances from the generators, there is chosen a form of isolating device T in which there occurs conversion of the electrical signals from the generators into another physical quantity such as, for example, light or hydraulic or pneumatic pulses. Thereafter, a reconversion into electrical signals takes place, so that an electrical signal is present at the input and at the output of each isolating device T. The conversion of the electrical input signals into light, hydraulic or pneumatic pulses and thereafter back into electrical signals takes place only in the direction in which the information flows, for example, from the generators to the individual coincidence circuits while conversion in the backward direction, i.e. from the coincidence circuits to the generators, is not possible. The physical quantity (light, hydraulic or pneumatic signals) into which the electrical signal is converted is preferably the one most weakly represented of all disturbing quantities likely to effect the control apparatus. If, for example, the control apparatus and the units of the further apparatus are in places in which there is little optical radiation (in the visible or invisible frequency range), or in which such radiation can be readily screened off, there are preferably employed isolating devices in which the electrical inputs are converted into visible or invisible optical signals, for example by means of a light-emitting semiconductor diode, and then converted back into electrical output signals, for example by means of a photo-sensitive semiconductor. Such isolating devices are known and are called "optocouplers". The signals can only pass, in the optocoupler, from the light-emitting semiconductor diode to the photo-sensitive semiconductor, but never in the reverse direction. Therefore, reactions of any disturbing signals cannot take place in the line in the direction opposite to the normal direction of flow of information. The aforesaid semiconductors are disposed in a housing in the optocoupler. Optocouplers are described in the article "Optokoppler, dynamisches Verhalten" in the journal "Der Electroniker", No. 5, 6, year 1973. The same isolation of the backward transmission of disturbing signals is obtained by the use of a hydraulic or pneumatic isolating device in which the electrical input signals are converted into hydraulic or pneumatic signals by means of a suitable device, for example by a diaphragm adapted to be actuated by an electromagnetic coil. Movements of the diaphragm cause a reaction in a liquid or gaseous medium present in a transmission space, situated within the isolating circuit, at the other end of which is a similar diaphragm with an electromagnetic coil for converting the hudraulic or pneumatic signals into electrical signals. A further suitable isolating device consists merely of an electrical transformer with one or two electrical undirectionally conducting devices, for example diodes, disposed in the conducting line leading to the primary winding or from the secondary winding. The unidirectionally conducting device(s) ensure that no signal transmission can take place in the backward direction, i.e. from the output of the isolating circuit to its input.

The embodiment illustrated in FIG. 5 is similar to the one shown in FIG. 4 except as follows. As mentioned before, isolating devices T are connected in the respective lines between the generators and the coincidence gates. Further isolating devices are connected in the lines 35, 36 and 37 between the coincidence gate outputs and the respective phase comparators. Each generator comprises, for each output line from that generator, a respective amplifying output stage provided with a signal limiter and short-circuit protection. The several output stages comprised in each generator are shown in the Figure as a single block referenced 64. Further isolating circuits T are provided in lines 61, 62 and 63 branching from a common line 60 through which extraneous signals SN are fed so as to synchronise the individual generators G1, G2, Gg. The extraneous signals pass as desired value signals to further phase comparators 121, 131 and 141 which compare them with the actual-value signals arriving from the coincidence circuits along lines 54 to 59 and lines 65 to 67 (which also include devices T) and, in the event of the actual value deviating from the desired value (which values represent frequency or phase for example) control the associated generator to bring the actual value more into agreement with the desired value. It will be seen that the phase comparators 12, 13 and 14 are still present, these being fed as in FIG. 3 and 4 with "actual value" signals from the generators G1, G2 and Gg and with "desired-value" signals A1, A2 and Ag from the gates. Thus, signals A1, A2 and Ag are used as actual value signals for the comparators 121, 131 and 141 and as desired value signals for the comparators 12, 13, 14. Each generator in FIG. 5 is thus provided with a first control loop (the comparator 12, 13 or 14) and a second control loop (the comparator 121, 131 or 141).

Figure 6:
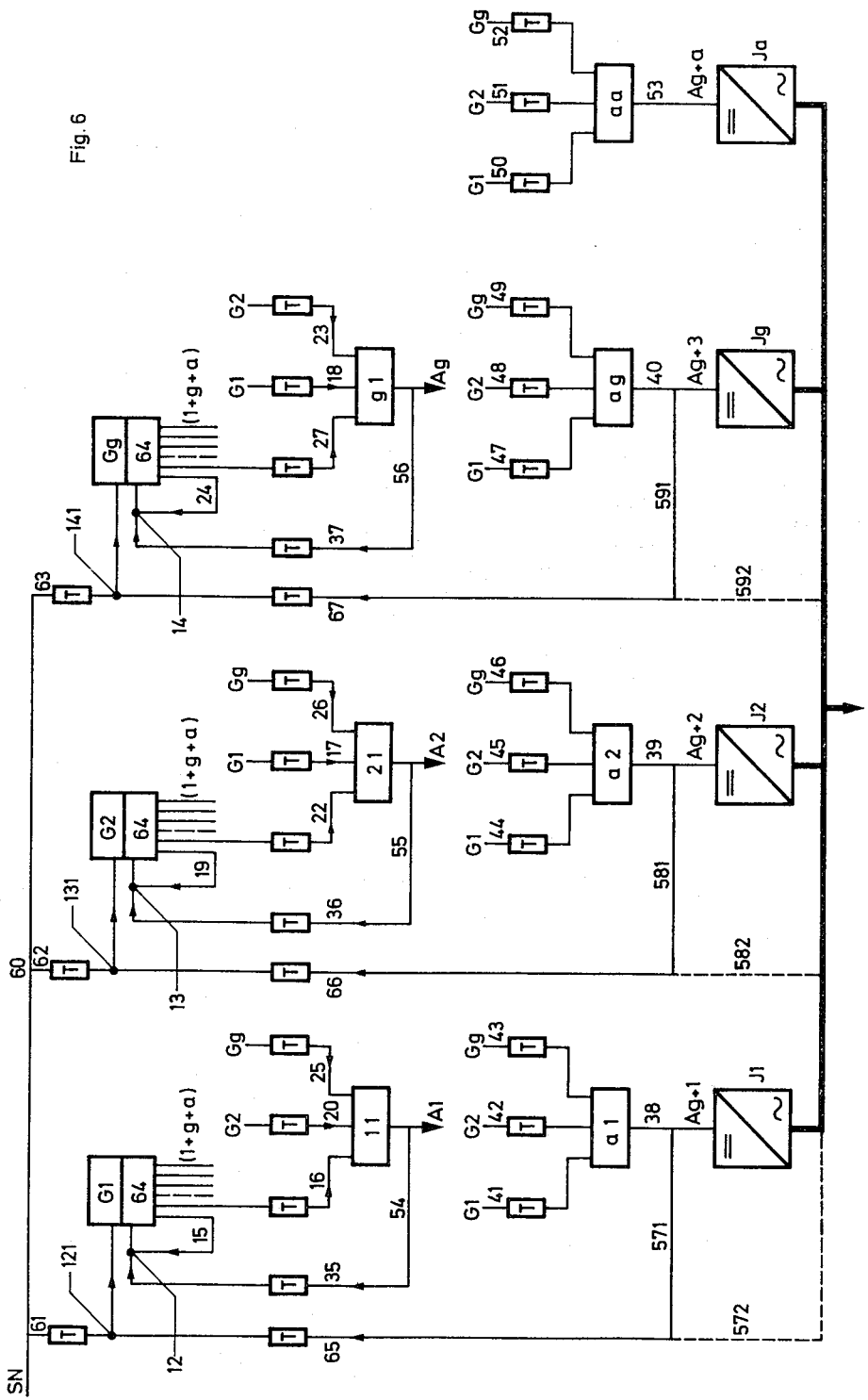

FIG. 6 illustrates a further embodiment of the control apparatus and here the further apparatus to be controlled by the control apparatus is also shown. The difference between the control apparatus of FIG. 5 and the control apparatus of FIG. 6 resides in that, in FIG. 6, the lines 57, 58, 59 through which the output signals A1, A2, Ag are applied as actual values to the phase detectors 121, 131, 141 of the second control loops have been removed, and instead the actual values comprise the output signals $Ag+1-Ag+3$ of other coincidence circuits a1, a2, ag through the lines 571, 581, 591 to the phase detectors 121, 131, 141. Instead of these output signals, like output signals may be applied through the chainlined conductors 572, 582, 592 . . . to the said phase detectors of the second control loop from the output side of the further apparatus. The further apparatus comprises a continuous current supply system comprising a series of independent inverters, J1, J2, Jg which are connected to the output lines 38, 39, 40, 53 of the coincidence circuits a1, a2, ag, aa. The inverters are so-called static inverters which comprise semiconductor controlled rectifier elements and which produce alternating current of any desired frequency from direct current. Only four inverters are shown but it will be understood that there are further inverters connected to the other coincidence circuits 11, 21, g1. Each of the inverters, of which there is a number g+a present, constitutes an independent unit of the whole redundant system. The outputs of the inverters are connected in parallel to form a single output. In this way, the power of the alternating current is increased as desired, which is important for continuous current supply systems. As mentioned before, instead of the continuous current supply system, the control apparatus could be used to control electric drives for rotary printing machines or rolling mills, or parts of a computer. It is here to be noted that the second control loops, i.e. the synchronisation with the common external signal SN, are not always necessary.

Figure 7:
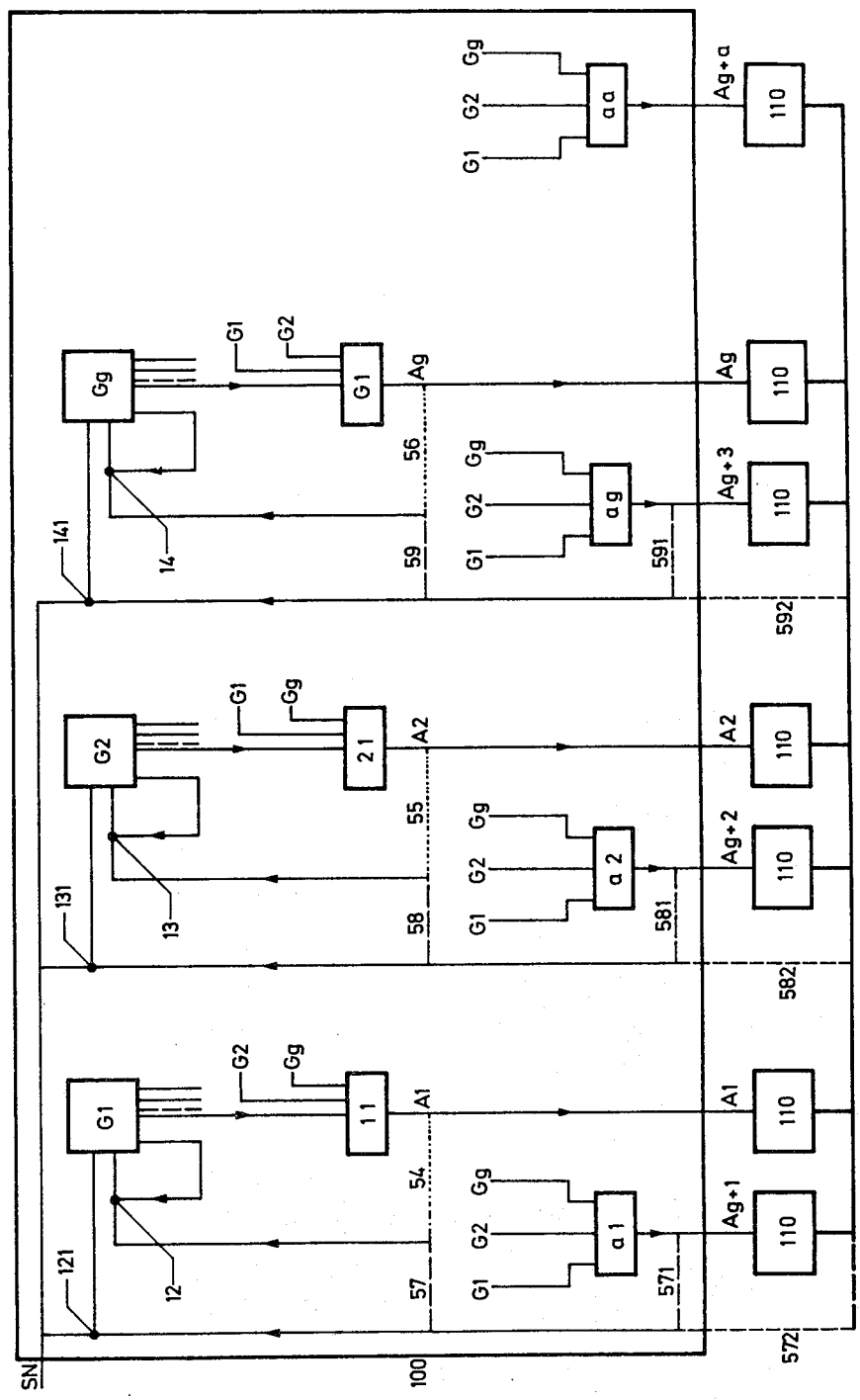

As shown in FIG. 7, the control apparatus comprising the generators G1, G2 . . . Gg, the g+ga coincidence circuits 11, 21, g1, a2, ag, aa forming an equal number of outputs for the output signals A1, A2, Ag, Ag+1, Ag+2, Ag+3, Ag+a may be combined as a unit of apparatus 100 and connected to the independent units 110 of the further apparatus by conductor lines. Thus the unit 100 may be disposed at some distance from the individual independent units 110. It is indicated by the chain-lines 57, 58, 59 and by the dotted lines 54, 55, 56 that it is possible for the output signals A1, A2, Ag to be applied to the two control loops. The dotted lines 54, 55, 56 can be removed and replaced by the chain lines 571, 581, 591. The output signals ag+1, Ag+2, Ag+3 then pass to both control loops. The operation of the control loops is in no way changed by this because the last-mentioned output signals are exactly identical with the output signals from the coincidence circuits 11, 21, g1. The chain-lined lines 57, 58, 59 may also be removed and the dotted lines 54, 55, 56 restored. The first control loop (12, 13, 14) is then controlled by the output signals (desired value) of the coincidence circuits 11, 21, g1, and the second control loop (121, 131, 141) is controlled by the output signals (actual value) of the coincidence circuits a1, a2, ag. For the sake of completeness, the chain-lined lines 572, 582, 592 are also shown. These lines may be substituted for the other lines. The large number of control possibilities for the control loops in the redundant generator will here be seen. In the case of the embodiment illustrated in FIG. 7 also, it is possible to dispense with synchronisation by an extraneous signal SN which is applied as desired value to the phase detectors of the second control loop.

Figure 8:
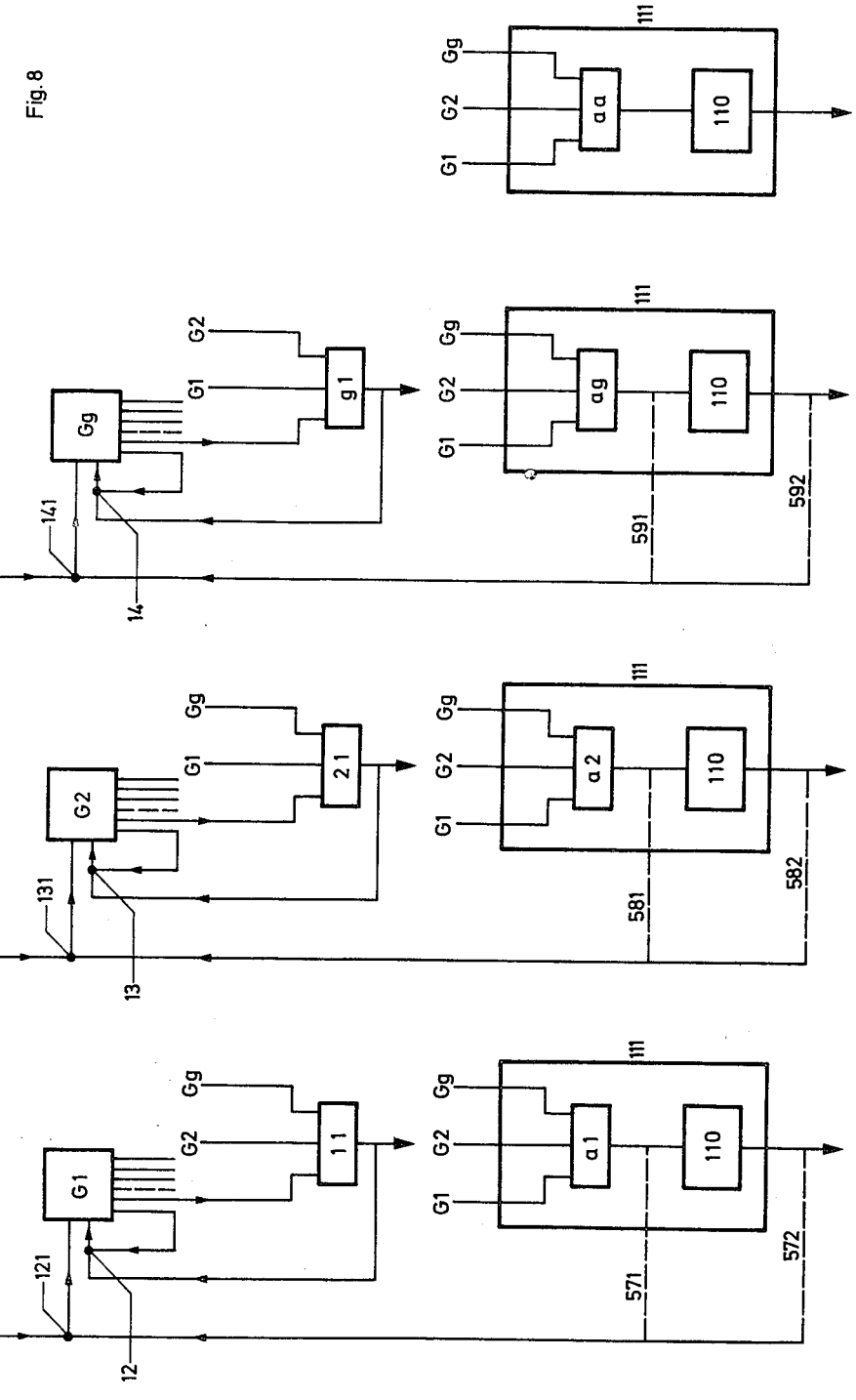

There is illustrated in FIG. 8 an embodiment which shows that some parts of the control apparatus can form integral parts of the independent units 111 of the redundant system i.e. the further apparatus. Thus, a coincidence circuit is provided in each of the independent units 111. In this example, it is intended to control only four independent units and so the three coincidence circuits 11, 21, g1 are used only to provide signals for the phase comparators. Of course, these coincidence circuits 11, 21 g1 could be incorporated in independent units of the further apparatus in exactly the same way as the other coincidence circuits a1, a2, ag, aa. The manner of operation in the case of the embodiment of FIG. 8 is exactly the same as that of FIG. 7. The embodiment illustrated in FIG. 9 is not constructed as a separate control unit but instead all its parts are distributed as integral parts of the items of apparatus to be controlled. Thus a generator and one or two coincidence circuits with one or two control loops are provided in each independent unit 112 of a redundant system. The number g+a of the independent units 112 may be chosen as desired and need not agree with the number g of generators which is defined by the desired degree of redundancy.

In all embodiments described with reference to FIGS. 3 to 9, it is preferred that the individual generators G1, G2, Gg be fed with supply energy independently of one another with their associated phase detectors and coincidence circuits. Thus each separate group — for example generator G2, coincidence circuit 21, phase detectors 13, 131 — has its own voltage source or current source. In this way, the desired degree of redundancy is ensured. If, for example, two or more generators have a common voltage source or current source, then in the event of a disturbance in operation of this one source, the desired degree of redundancy would no longer exist, because the two or more generators would no longer be operable.

We claim:
1. Control apparatus including a co-ordinated group of independently operable signal generators for producing output signals for control of separately controllable portions of an apparatus system with reliability-assurance redundance by means of independent electric signal supply circuits, said control apparatus comprising:
   a number $g$ of electric signal supply circuits, which number is greater by at least 1 than twice a chosen degree of redundancy $r$ of the signal generator group, each of said signal supply circuits containing:
      an independently operable signal generator (G1, G2 . . . Gg) for generating timing pulses (S1$n$, S2$n$, Sg$n$; S1$n$+1, Sg$n$+1);
      at least one gate circuit (11, 21, $g$1, $a$1, $a$2, $ag$) for furnishing an output to a portion of said apparatus system, said gate circuit being responsive to the outputs of all the signal generators of the respective signal supply circuits for providing said output signals only when the number of said outputs of said signal generators with pulses (S1$n$, S2$n$; S1$n$+1, Sg$n$+1) timed within said predetermined interval ($\Delta tn$, $\Delta tn$+1) exceeds by at least 1 the said degree of redundance $r$, and
      phase correcting circuit means (12, 13, 14; 121, 131, 141) for furnishing an output to said phase correcting circuit means ($\Delta tn$, $\Delta tn$+1) and having as inputs at least an input supplied by an output of said generator of the same signal supply circuit and an input supplied by the output of one of said gate circuits of the same signal supply circuit.

2. Control apparatus as defined in claim 1, which also comprises at least one additional circuit ($aa$) responsive to outputs of all the signal generators of the respective signal supply circuits for providing output only when the number of said signals with pulses timed within sid predetermined interval ($\Delta tn$, $\Delta tn+1$) exceeds by at least 1 the said degree of redundance $r$.

3. Control apparatus as defined in claim 1, in which the number $g$ of said electric signal supply circuits and hence also the number of said signal generators is greater by one than twice the degree of redundance $r$ chosen for the generator group.

4. Control apparatus according to claim 1, wherein said phase correcting means of each of said signal supply circuits comprises a comparator (121, 131, 141) having a first input connected to a common synchronisation signal input (SN) of the control apparatus, a second input connected to receive the output signals produced by one of said gate circuits of the same signal supply circuit, and an output connected to a control input of the signal generator of the same signal supply circuit, said comparator being operable to compare the signals received at its first input with the signals received at its second input and, if they do not substantially coincide, to adjust said generator to bring corresponding future signals more into coincidence.

5. Control apparatus according to claim 1, wherein each said signal generator has a separate output terminal by which the generator is connected to the phase corrector circuit means of the same signal supply circuit, and also has for each gate circuit to which it is connected, a respective separate output terminal connected to the respective gating circuit by a respective separate signal transmitting line (16 – 18, 20, 22, 23, 25 – 27, 41 – 52).

6. Control apparatus according to claim 5, wherein for each said generator output terminal which is connected to a gate circuit the generator comprises a respective output amplifier stage for amplifying the signals supplied to said gate circuit via the associated generator output terminal.

7. Control apparatus according to claim 5, wherein for each said generator output terminal which is connected to a gate circuit and for said generator output terminal connected to said phase corrector circuit means the generator comprises a respective output amplifier stage for amplifying the signals supplied via the associated generator output terminal.

8. Control apparatus according to claim 6, wherein each said output amplifier stage comprises short-circuit protection means for protecting the output amplifier stage from becoming damaged if a short-circuit occurs on the associated generator output terminal, and signal limiting means for protecting the output amplifier stage from becoming damaged if overvoltages occur in an output connecting line connected to the associated generator output terminal.

9. Control apparatus according to claim 1, wherein there are signal transmitting lines (16 – 18, 20, 22, 23, 25 – 27, 41 – 52) connected to said generators for delivering the signals produced by the generators, and wherein the transmitting lines comprise respective series connected isolating devices (T) which are operable to pass the signals produced by the generators and to reject disturbing signals.

10. Control apparatus according to claim 9, wherein said signals produced by the generators are electrical signals and said isolating devices each comprise first converter means for converting the electrical signals received thereby into non-electrical signals, and second converter means arranged for receiving the non-electrical signals from the associated first converter means and for converting them back into electrical signals.

11. Control apparatus according to claim 1, wherein the phase corrector circuit means of each of said signal supply circuits comprises two comparators, one of which has an input connected to an input terminal of the apparatus for receiving external synchronisation signals and an input connected to receive actual signals produced by one of said gate circuits or by a portion of said apparatus system controlled by one of said gate circuits, and the other of which has an input connected to receive the signals produced by the signal generator of the same signal supply circuit and an input connected to receive reference signals, said two comparators each being operable to compare the signals received thereby, and if they do not coincide, to so adjust the generator of the same signal supply circuit so that corresponding future signals will be brought more into coincidence.

12. A combination of individually controllable portions (j1, J2, Jg, Ja, 110) of an apparatus system and control apparatus including a co-ordinated group of independently operable signal generators for producing output signals for co-ordinated control of said portions of said apparatus system with reliability-assurance redundance by means of independent electric supply circuits, said control apparatus comprising:

a number $g$ of electric signal supply circuits, which number is greater by at least 1 than twice a chosen degree of redundance $r$ of the signal generator group, each of said signal supply circuits containing:

at least one gate circuit (11, 21, $g1$, $a1$, $a2$, $ag$) for furnishing an output to a portion of said apparatus system, said gate circuit being responsive to the outputs of all the signal generators of the respective signal supply circuits for providing said output signals only when the number of said outputs of said signal generators with pulses (S1$n$, S2$n$; S1$n$+1, S$gn$+1) timed within said predetermined interval ($tn$, $tn$+1) exceeds by at least 1 the said degree of redundance $r$, and phase correcting circuit means (12, 13, 14; 121, 131, 141) for furnishing an output to said phase correcting circuit means ($\Delta tn$, $\Delta tn$+1) and having as inputs at least an input supplied by an output of said generator of the same signal supply circuit and an input supplied by the output of one of said gate circuits of the same signal supply circuit, said portions of said apparatus system each being individually supplied with signals from one of said gate circuits of one of said signal supply circuits.

13. A combination according to claim 12, in which some of said apparatus system portions are redundant.

14. A combination according to claim 12, wherein the control apparatus is constructed as a self-contained unit and is connected to said apparatus system portions by way of signal transmitting lines.

15. A combination according to claim 12 wherein said gate circuits from which said apparatus system portions are supplied with signals are constructed as parts of the respective portions (111) of said apparatus system to which they supply signals.

16. A combination according to claim 12, wherein at least some of said apparatus system portions (112) each are constructed at least the generator, one gate circuit, and at least one phase corrector circuit of the phase corrector circuit means of one of said electric signal supply circuits.

* * * * *